(12) United States Patent
Lee et al.

(10) Patent No.: US 12,418,003 B2
(45) Date of Patent: Sep. 16, 2025

(54) LIGHT EMITTING DEVICE AND LIGHT EMITTING MODULE INCLUDING THE SAME

(71) Applicant: SEOUL VIOSYS CO., LTD., Ansan-si (KR)

(72) Inventors: JinWoong Lee, Ansan-si (KR); KyoungWan Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/427,456

(22) Filed: Jan. 30, 2024

(65) Prior Publication Data
US 2024/0170461 A1 May 23, 2024

Related U.S. Application Data

(63) Continuation of application No. 17/285,886, filed as application No. PCT/KR2019/015826 on Nov. 19, 2019, now Pat. No. 11,923,345.

(30) Foreign Application Priority Data

Nov. 21, 2018 (KR) .......................... 1020180144872

(51) Int. Cl.
*H01L 25/075* (2006.01)
*H10H 20/01* (2025.01)
(Continued)

(52) U.S. Cl.
CPC ......... *H01L 25/0753* (2013.01); *H10H 20/01* (2025.01); *H10H 20/856* (2025.01);
(Continued)

(58) Field of Classification Search
CPC . H01L 25/0753; H01L 33/0095; H01L 33/60; H01L 33/62; H01L 2933/0058;
(Continued)

(56) References Cited

U.S. PATENT DOCUMENTS 7,592,237 B2 9/2009 Sakamoto et al.
10,179,748 B2 1/2019 Marjanovic et al.
(Continued)

FOREIGN PATENT DOCUMENTS

CN 108335974 A 7/2018
KR 10-2007-0005 707 1/2007
(Continued)

OTHER PUBLICATIONS

International Search Report dated Mar. 23, 2020 in International Application No. PCT/KR2019/015826.
(Continued)

*Primary Examiner* — Brook Kebede
(74) *Attorney, Agent, or Firm* — Oblon, McClelland, Maier &Neustadt, L.L.P.

(57) ABSTRACT

A light emitting module including a mounting substrate, light emitting chips mounted on the mounting substrate, and pads, in which the light emitting chips include a first substrate, a first light emitting unit on a first surface of the first substrate, a second substrate spaced apart from the first substrate, and a second light emitting unit on a second surface of the second substrate, the first substrate includes a first side surface including a first modified surface, and the second substrate includes a second side surface facing the first side surface and including a second modified surface, the first modified surface includes first modified regions extended in a thickness direction and first ruptured regions disposed therebetween, the second modified surface includes second modified regions extended in the thickness direction and second ruptured regions disposed therebetween, and the first ruptured regions have the same width as the second ruptured regions.

17 Claims, 17 Drawing Sheets

(51) Int. Cl.
  *H10H 20/856* (2025.01)
  *H10H 20/857* (2025.01)
(52) U.S. Cl.
  CPC ....... *H10H 20/857* (2025.01); *H10H 20/0363* (2025.01); *H10H 20/0364* (2025.01)
(58) Field of Classification Search
  CPC ............ H01L 2933/0066; H10H 20/01; H10H 20/857; H10H 20/856
  See application file for complete search history.

(56) References Cited

U.S. PATENT DOCUMENTS

| | | | |
|---|---|---|---|
| 10,399,184 B2 | 9/2019 | Hosseini et al. | |
| 11,923,345 B2* | 3/2024 | Lee | H10H 20/856 |
| 2010/0038668 A1* | 2/2010 | Noma | H01L 33/44 |
| | | | 257/E33.001 |
| 2012/0261678 A1 | 10/2012 | Hiraiwa et al. | |
| 2015/0151380 A1 | 6/2015 | Hosseini | |
| 2016/0225740 A1 | 8/2016 | Cheng et al. | |
| 2016/0336496 A1* | 11/2016 | Marutani | G02B 6/0006 |
| 2017/0294418 A1* | 10/2017 | Edmond | H01L 33/62 |
| 2017/0317230 A1* | 11/2017 | An | H01L 33/62 |
| 2018/0204771 A1 | 7/2018 | Morikazu et al. | |
| 2018/0240950 A1 | 8/2018 | Jang et al. | |

FOREIGN PATENT DOCUMENTS

| | | |
|---|---|---|
| KR | 10-2012-0068795 | 6/2012 |
| KR | 10-2013-0031377 | 3/2013 |
| KR | 10-2016-0005827 | 1/2016 |
| TW | 201444115 A | 11/2014 |
| TW | 201839829 A | 11/2018 |
| WO | WO 2014/002535 | 1/2014 |
| WO | WO 2015-095090 | 6/2015 |
| WO | WO 2016/006781 | 1/2016 |
| WO | WO 2017/065545 | 4/2017 |

OTHER PUBLICATIONS

Written Opinion dated Mar. 23, 2020, issued in International Application No. PCT/KR2019/015826.

Extended European Search Report in European Application No. 19887869.6 dated Aug. 19, 2022.

Office Action dated Jul. 21, 2023 issued in Taiwanese Application No. 108142169 with English Summary.

Office Action issued in Korean Patent Application No. 10-2018-0144872 dated Aug. 31, 2023 (with English translation).

Taiwanese Office Action issued Aug. 13, 2024 in Taiwanese Patent Application No. 113105658, 9 pages.

Combined Chinese Office Action and Search issued Aug. 1, 2024 in Chinese Patent Application No. 201911140354.5 (with English Translation of Office Action only), 16 pages.

\* cited by examiner

LIGHT EMITTING DEVICE AND LIGHT EMITTING MODULE INCLUDING THE SAME

CROSS REFERENCE TO RELATED APPLICATIONS

This application is a continuation of U.S. patent application Ser. No. 17/285,886 filed Apr. 15, 2021, which is the National Stage Entry of International Application No. PCT/KR2019/015826, filed on Nov. 19, 2019, and which claims priority from and the benefit of Korean Patent Application No. 10-2018-0144872, filed on Nov. 21, 2018, each of which is incorporated by reference for all purposes as if fully set forth herein.

BACKGROUND

Exemplary embodiments of the invention relate generally to a light emitting device and a light emitting module including the same, and more particularly, to a nitride-based light emitting device and a light emitting module including the same.

Discussion of the Background

A light emitting diode is an inorganic light source widely used in various fields, such as a display device, a vehicle lamp, and a general lighting. The light emitting diode has longer lifetime, lower power consumption, and quick response speed than conventional light sources, and thus, is rapidly replacing the conventional light sources.

The light emitting diodes are generally formed on a wafer such as sapphire, and then are diced into light emitting chips through a dicing process. Hereinafter, a conventional process of dicing the wafer into the light emitting chips will be described.

FIG. 1 is a cross-sectional view illustrating a conventional method of cutting an ingot to fabricate a wafer, and FIG. 2 is a cross-sectional view of the wafer shown in FIG. 1.

Referring to FIGS. 1 and 2, a wafer WF having a flat zone FZ is formed by growing an ingot along a c-axis, and cutting and processing the ingot. The ingot is cut at a predetermined angle β off-axis from the c-axis. As such, when the wafer WF is diced into a plurality of chips, an m-plane exposed from the chip has a slope with respect to the top surface of the chip.

Referring to FIG. 2, a direction parallel to the extension direction of the flat zone FZ in the wafer WF is an m-axis. Hereinafter, the m-axis direction is referred to as a first direction DR1, and a direction perpendicular to the m-axis is referred to as a second direction DR2. For example, the second direction DR2 is an a-axis. An a-plane is a plane which is to exposed after the wafer WF is cut in the first direction DR1, and the m-plane is a plane which is exposed after the wafer WF is cut in the second direction DR2.

Through a conventional process, a plurality of light emitting diodes are formed on the wafer WF. Since the process of forming the light emitting diodes on the wafer WF is well known in the art, detailed descriptions thereof will be omitted herein.

Then, the light emitting diodes formed on the wafer WF are diced through laser.

FIG. 3A is a schematic view illustrating a conventional method of cutting a wafer using laser.

Referring to FIG. 3A, dotted-type modified regions MDF are formed by concentrating and emitting a laser beam to a predetermined depth of the wafer. Then, the wafer is ruptured based on the modified regions, and is separated into light emitting chips including light emitting diodes. The ruptured regions are extended in a direction perpendicular to the thickness direction of the wafer so as to connect the dotted-type modified regions MDF.

Due to the crystal structure of the wafer, the wafer is more easily cut in the first direction than in the second direction. As such, although a smaller amount of laser beam is emitted in the second direction than in the first direction, the wafer is rapidly and easily cut in the second direction. The surface cut in the second direction has an inclined m-plane.

The light emitting chips cut through the conventional process each have a small size, and a side surface inclined with respect to the top surface thereof. As such, when the light emitting chip is picked up and transferred to a target position, the light emitting chip may be rotated. In some cases, the light emitting chip may fall down on a circuit substrate onto which the light emitting chip has been transferred due to the inclined side surface thereof. Furthermore, when the light emitting chips are arbitrarily rotated and mounted on the circuit substrate while being picked up and transferred, the inclined side surfaces may be irregularly arranged and cause light generated from the plurality of light emitting chips mounted on the circuit substrate to have irregular beam angles.

FIG. 3B shows photographs of the substrate formed through the method described with reference to FIG. 3A. In FIG. 3B, the left photograph shows the top surface of the substrate, the middle photograph is a photograph obtained by tilting a first side surface of the wafer cut in the first direction, and the right photograph shows a second side surface of the wafer cut in the second direction. A left portion in the middle photograph shows a part of the second side surface.

As can be seen from FIG. 3B, the substrate cut is tilted in one direction. The angles between the top surface of the substrate and the first and second side surfaces shown in FIG. 38 are 84.3° and 95.4°, respectively, which deviate from 90° indicating that the cut substrate is inclined in one direction. Furthermore, FIG. 3B shows that the modified regions and the ruptured regions are parallel to the thickness direction of the substrate.

The above information disclosed in this Background section is only for understanding of the background of the inventive concepts, and, therefore, it may contain information that does not constitute prior art.

SUMMARY

Light emitting chips constructed according to exemplary embodiments of the invention have uniform luminance, and a light emitting module including the same.

Additional features of the inventive concepts will be set forth in the description which follows, and in part will be apparent from the description, or may be learned by practice of the inventive concepts.

According to an exemplary embodiment, a light emitting module includes: a mounting substrate; a plurality of light emitting chips mounted on the mounting substrate; and a plurality of pads disposed between the light emitting chips and the mounting substrate, in which each of the light emitting chips includes: a first substrate; a first light emitting unit disposed on a first surface of the first substrate: a second substrate spaced apart from the first substrate; and a second light emitting unit disposed on a second surface of the second substrate, the first substrate includes a first side surface including a first modified surface, and the second substrate includes a second side surface facing the first side surface of the first substrate and including a second modified surface, the first modified surface includes first modified regions extended in a thickness direction of the first substrate and first ruptured regions disposed between the respective modified regions, the second modified surface includes second modified regions extended in a thickness direction of the second substrate and second ruptured regions disposed between the respective second modified regions, and the first ruptured regions of the first modified surface have the same width as the second ruptured regions of the second modified surface.

Each of the first and second modified regions may be modified by laser irradiation thereto.

The width of each of the first and second ruptured regions may be greater than that of each of the first and second modified regions.

The first substrate may further include a third side surface adjacent to the first side surface thereof, the third side surface including a third modified surface, and the third modified surface may include third modified regions extended in the thickness direction of the first substrate and third ruptured regions disposed between the respective third modified regions.

The width of each of the first ruptured regions of the first modified surface may be less than that of each of the third ruptured regions of the third modified surface.

The first substrate may include sapphire, the first side surface of the first substrate may include an m-plane and a plane tilted with respect to the m-plane, and the third side surface of the first substrate may include an a-plane and a plane tilted with respect to the a-plane.

Each of the third ruptured regions of the third modified surface may have a first width, and the third modified surface may further include a cut region having a second width less than the first width, the cut region being disposed between a corner, at which the first side surface and the third side surface meet each other, and one of the third modified regions closest to the corner.

The first side surface of the first substrate may have a slope of 88.5° to 91.5° with respect to an interface between the first substrate and the first light emitting unit.

The second side surface of the second substrate may have a slope of 88.5° to 91.5° with respect to an interface between the second substrate and the second light emitting unit.

Each of the first ruptured regions of the first modified surface may have a first width, and the first modified surface may further include a cut region having a second width less than the first width, the cut region being disposed between a corner, at which the first side surface and a third side surface adjacent to the first side surface meet each other, and one of the first modified regions closest to the corner.

The first emitting unit may include: a first conductive type semiconductor layer disposed on the first surface of the first substrate; an active layer disposed on a partial area of the first conductive type semiconductor layer to expose a part of the first conductive type semiconductor layer; a second conductive type semiconductor layer disposed on the active layer to expose the part of the first conductive type semiconductor layer; a first reflecting layer covering the first substrate, the first conductive type semiconductor layer, the active layer, and the second conductive type semiconductor layer, the first reflecting layer having a first hole and a second hole which expose the first and second conductive type semiconductor layers, respectively; a first pad disposed on the first reflecting layer, and electrically connected to the first conductive type semiconductor layer through the first hole; and a second pad disposed on the first reflecting layer, and electrically connected to the second conductive type semiconductor layer through the second hole.

The first reflecting layer may expose an edge of the first surface of the first substrate.

The light emitting module may further include a second reflecting layer disposed on a third surface of the first substrate opposite to the first surface thereof.

The first reflecting layer may be configured to reflect two different wavelengths of light, and the second reflecting layer may be configured to reflect one wavelength of light.

The first reflecting layer may have a greater thickness than the second reflecting layer.

The second reflecting layer may expose an edge of the third surface of the first substrate.

According to another exemplary embodiment, a light emitting device includes: a substrate; and a light emitting unit disposed on a first surface of the substrate, in which the substrate includes a first side surface, a second side surface adjacent to the first side surface, a corner at which the first side surface and the second side surface meet each other, and a cut region, in which the substrate includes first modified regions extended in a thickness direction of the substrate and having a first width, and first ruptured regions disposed between the respective first modified regions and having a second width, the cut region has a third width less than the second width, and disposed between the corner and one of the first modified regions closest to the corner.

Each of the first modified regions may be modified by laser irradiation thereto.

The first side surface of the substrate may have a slope of 88.5° to 91.5° with respect to an interface between the substrate and the light emitting unit.

The second side surface adjacent to the first side surface may include second modified regions continuously extended in the thickness of the substrate and second ruptured regions disposed between the respective second modified regions, and each of the second ruptured regions of the second side surface may each have a width less than the first width.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
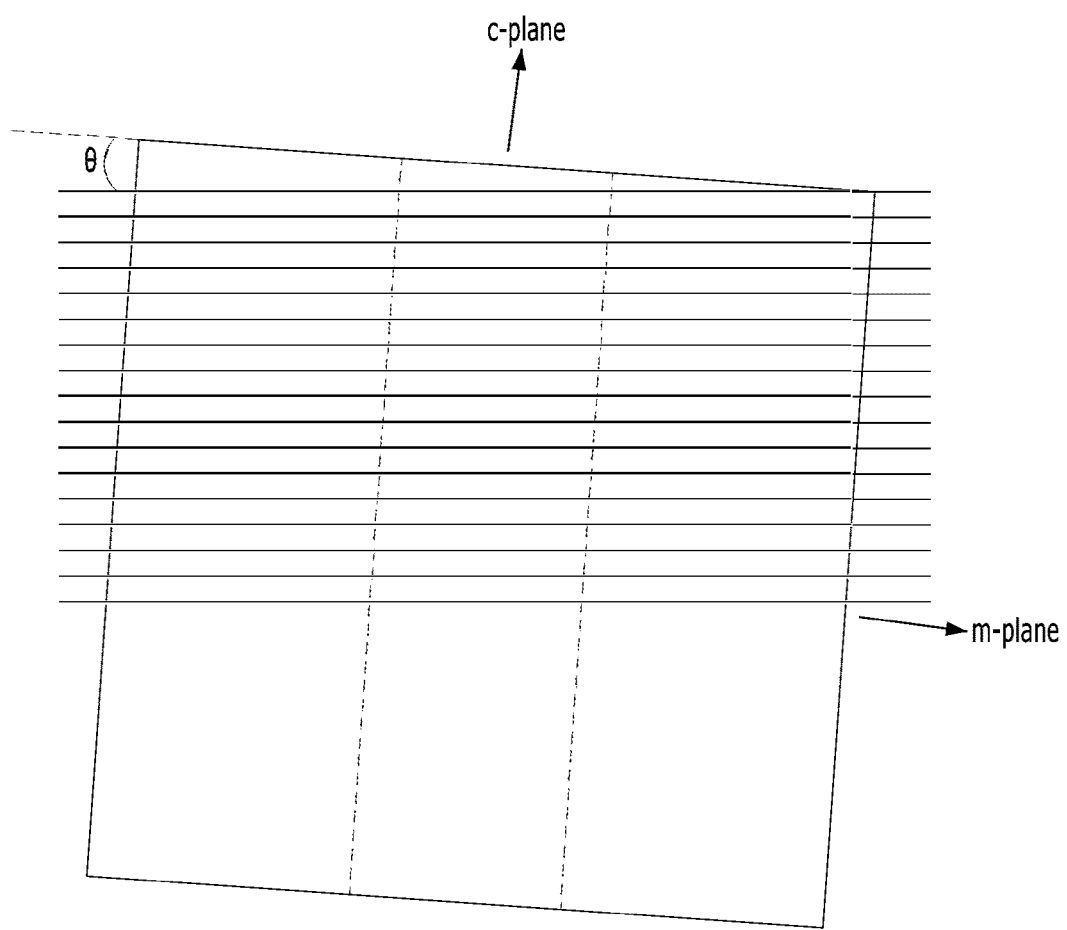
FIG. 1 is a cross-sectional view illustrating a conventional method of cutting an ingot to fabricate a wafer.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereafter, a light emitting chip in accordance with exemplary embodiments will be described in detail.

FIGS. 4A, 4B, 5, 6A, 6B, 7, 8A, 8B, 9A, 9B, 10A, 10B, 11, 12, 13, 14A, 14B, 15A, 15B, 16A, 16B, 17A and 17B are planar views and cross-sectional views illustrating a method for fabricating a light emitting module according to an exemplary embodiment.

Figure 4A:
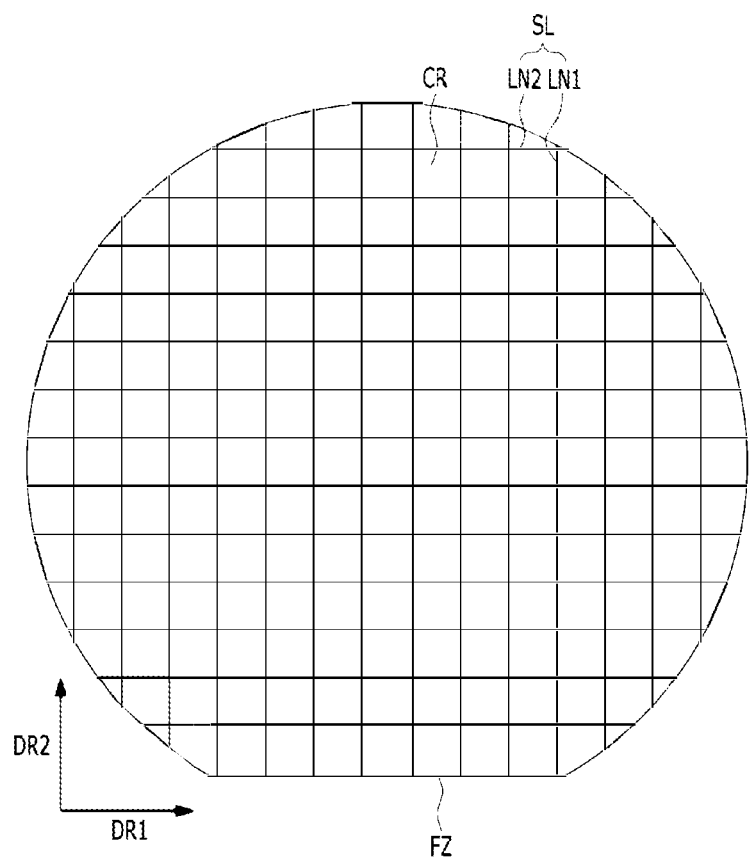
FIGS. 4A, 4B, 5, 6A, 6B, 7, 8A, 8B, 9A, 9B, 10A, 10B, 11, 12, 13, 14A, 14B, 15A, 15B, 16A, 16B, 17A and 17B are planar views and cross-sectional views illustrating a method of fabricating light emitting modules according to an exemplary embodiment.
Figure 4B:
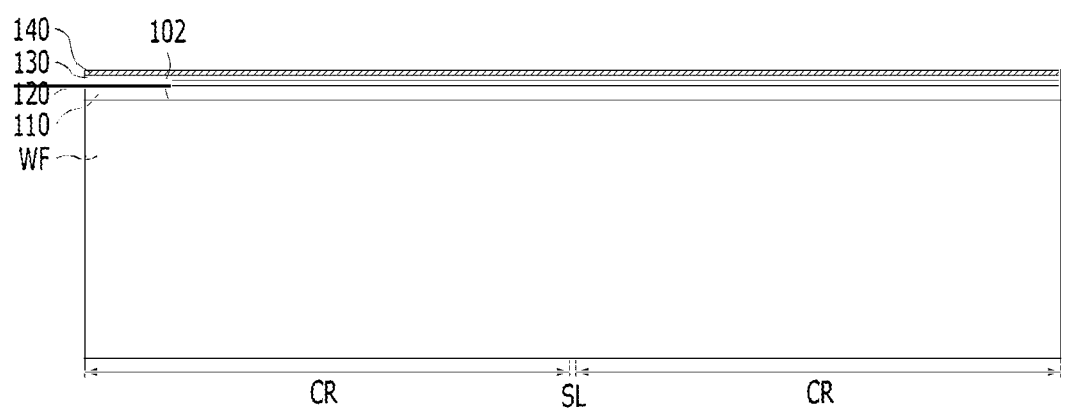

Referring to FIGS. 4A and 4B, a first conductive type semiconductor layer 110, an active layer 120, a second conductive type semiconductor layer 130, and an ohmic layer 140 may be formed over a wafer WF.

According to an exemplary embodiment, the wafer WF may be a wafer obtained from an ingot of FIG. 1. The wafer WF may include sapphire, for example. Referring to FIG. 4A, a direction parallel to the extension direction of a flat zone FZ in the wafer WF may be an m-axis. Hereinafter, the m-axis direction is referred to as a first direction DR1, and a direction perpendicular to the m-axis is referred to as a second direction DR2. For example, the second direction DR2 may be an a-axis. As described above, an a-plane may be a plane which is exposed after the wafer WF is cut in the first direction DR1, and an m-plane may be a plane which is exposed after the wafer WF is cut in the second direction DR2.

According to an exemplary embodiment, the wafer WF may include chip regions CR and a scribe line SL, which defines the chip regions CR and isolates the chip regions CR from each other. Light emitting structures may be formed in the respective chip regions CR.

For example, each of the chip regions CR has substantially a square shape when viewed from the top, and the scribe line SL may include first lines LN1 and second lines LN2. The first lines LN1 extend in the first direction DR1 and are parallel to each other, and the second lines LN2 extend in the second direction DR2 and are parallel to each other. The scribe line SL may have a mesh structure, in which the first and second lines LN1 and LN2 cross each other.

For example, sapphire may have a crystal structure with hexa-rhombo R3c symmetry. Furthermore, sapphire has lattice constants of 13.001 Å and 4.758 Å in c-axis and a-axis directions, respectively, and includes a C (0001) surface. A (1120) surface, R (1102) surface, and the like. The C surface of sapphire is stable at high temperature, and thus, a nitride thin film may be easily grown thereon. As such, sapphire may be used as a substrate for growing a nitride semiconductor.

The first conductive type semiconductor layer 110, the active layer 120, and the second conductive type semiconductor layer 130 may be formed over the wafer WF through a growth method, such as metal-organic chemical vapor deposition (MOCVD), molecular beam epitaxy (MBE), hydride vapor phase epitaxy (HVPE), or metal-organic chloride (MOC).

The first conductive type semiconductor layer 110 may be a gallium nitride-based semiconductor layer doped with an n-type impurity, for example, silicon (Si). The second conductive type semiconductor layer 130 may be a gallium nitride-based semiconductor layer doped with a p-type impurity, for example, magnesium (Mg). Unlike the above-described structure, the first conductive type semiconductor layer 110 may be a p-type semiconductor layer, and the second conductive type semiconductor layer 130 may be an n-type semiconductor layer. Each of the first and second conductive type semiconductor layers 110 and 130 may be formed as a single layer. However, the inventive concepts are not limited thereto, and in some exemplary embodiments, each of the first and second conductive type semiconductor layers 110 and 130 may have a multilayer or superlattice layer structure. The active layer 120 may include a multi quantum well (MQW), and have a composition ratio that can emit light of a desired peak wavelength. For example, the active layer 120 may emit light with a peak wavelength in a UV wavelength band or light with a peak wavelength in a blue wavelength band.

The ohmic layer 140 may be formed on the second conductive type semiconductor layer 130 through a deposition process such as chemical vapor deposition (CVD). For example, transparent conductive oxide (TCO), such as indium tin oxide (ITO) or zinc oxide (ZnO) may be used as the ohmic layer 140.

Figure 5:
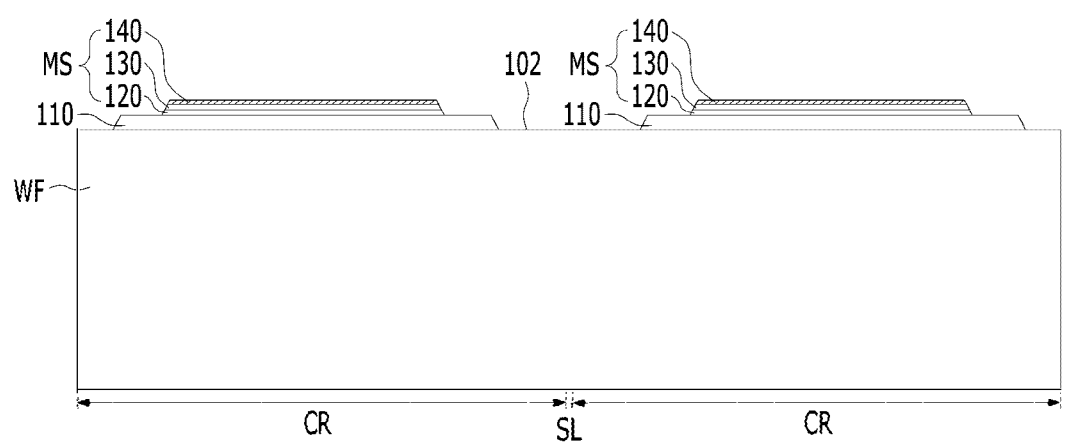

Referring to FIG. 5, the ohmic layer 140, the second conductive type semiconductor layer 130, and the active layer 120 may be etched to form a plurality of mesa structures NIS to expose the first conductive type semiconductor layer 110. Each of the mesa structures MS may be disposed in the chip region CR.

The first conductive type semiconductor layer 110 may be etched to form the first conductive type semiconductor layers 110 isolated from each other. The first conductive type semiconductor layer 110 may be disposed in the chip region CR. The mesa structure MS may have a size less than that of the first conductive type semiconductor layer 110, and partially expose the first conductive type semiconductor layer 110.

For example, after the mesa structures MS are formed, the first conductive type semiconductor layer 110 may be etched to isolate each chip region CR. As another example, after the first conductive type semiconductor layer 110 is etched to isolate each chip region CR, the mesa structures MS may be formed.

Figure 6A:
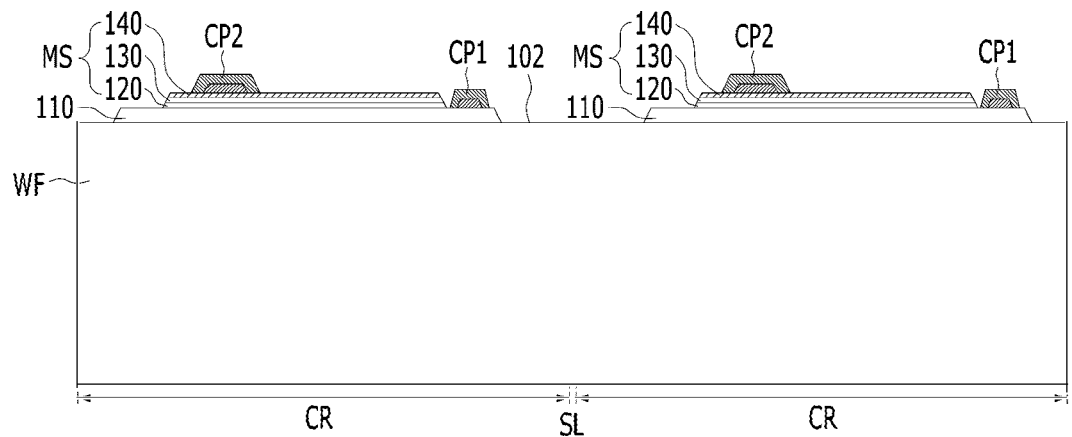
Figure 6B:
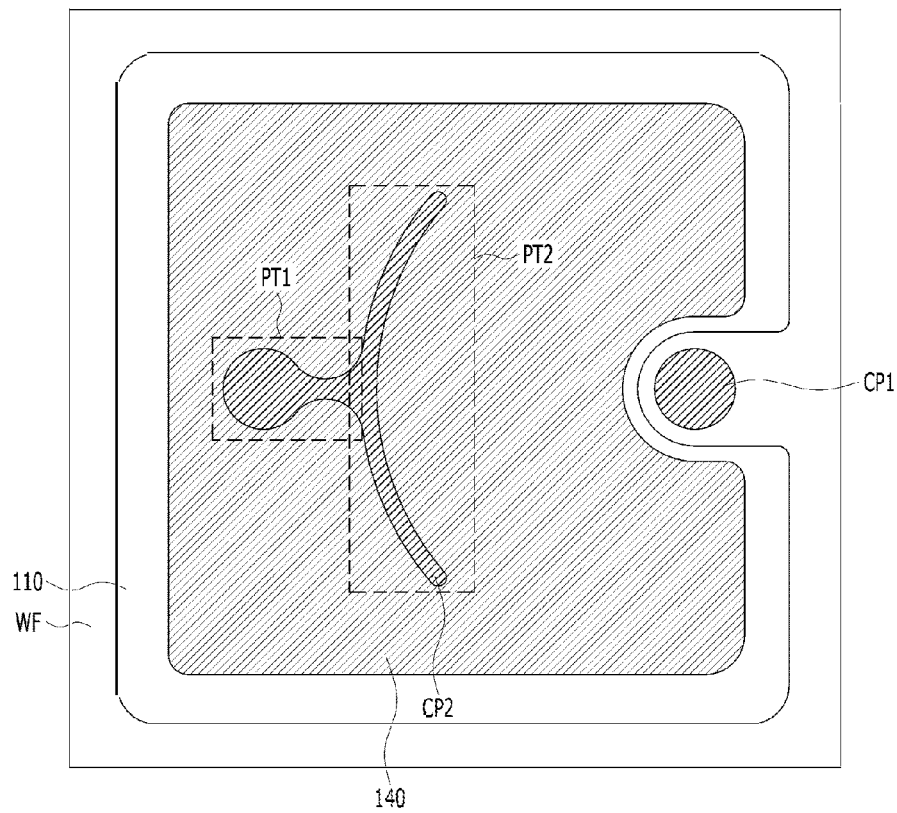

Referring to FIGS. 6A and 6B, a first conductive pattern CP1 may be formed on the first conductive type semiconductor layer 110 exposed by each of the mesa structures MS, and a second conductive pattern CP2 may be formed on each of the ohmic layers 140.

For example, each of the first and second conductive patterns CP1 and CP2 may include at least one selected from the group consisting of nickel (Ni), titanium (Ti), chrome (Cr), aluminum (Al), gold (Au), and tantalum (Ta).

FIG. 6B is a plan view of the first and second conductive patterns CP1 and CP2 formed in one cell region CR according to an exemplary embodiment. As illustrated in FIG. 6B, the second conductive pattern CP2 may include a first part PT1 extending toward the first conductive pattern CP1 and a second part PT2 extending from the first part PT1 in a direction substantially perpendicular to a direction facing the first conductive pattern CPL. For example, the second part PT2 may have a structure in which the edges thereof are bent toward the first conductive pattern CP1. The second conductive pattern CP2 including the first and second parts PT1 and PT2 may improve the current spread characteristics of the light emitting chip.

For example, a conductive layer may be formed over the wafer WF where the mesa structures MS and the first conductive type semiconductor layers 110 are formed. The conductive layer may have a multilayer structure. Then, the first and second conductive patterns CP1 and CP2 may be formed by performing a lift-off process on the conductive layer. The first conductive pattern CP1 may be electrically connected with the first conductive type semiconductor layer 110, and the second conductive pattern CP2 may be electrically connected to with the ohmic layer 140.

Figure 7:
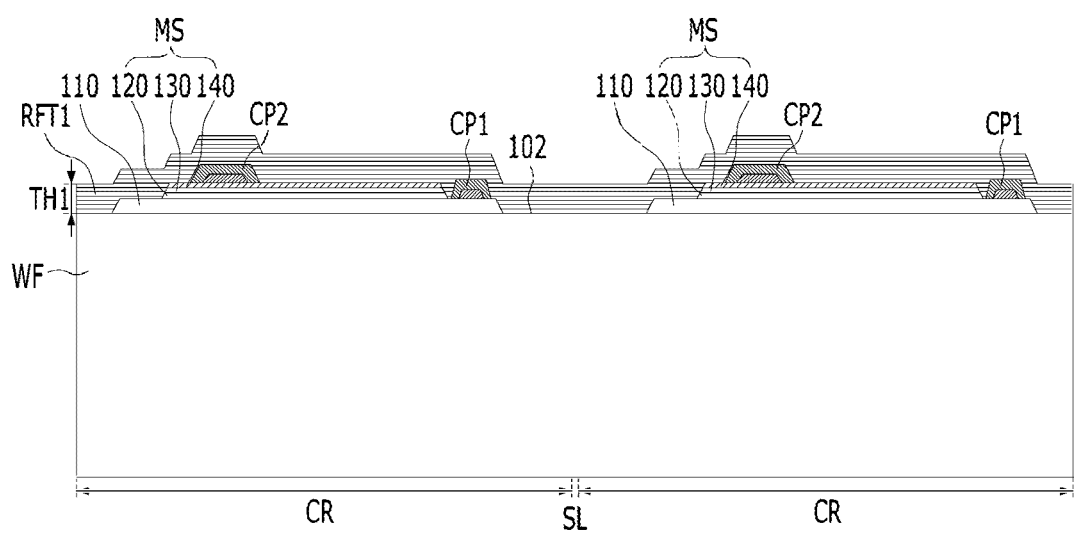

Referring to FIG. 7, a first reflecting layer RFT1 may be formed over the wafer WF and cover the first conductive patterns CP1, the second conductive patterns CP2, the mesa structures MS, and the first conductive type semiconductor layers 110.

The first reflecting layer RFT1 may include a distributed Bragg reflector (DBR) having a structure in which silicon oxide ($SiO_2$) and titanium oxide ($TiO_2$) are alternately stacked. According to an exemplary embodiment, the first reflecting layer RFT1 may reflect light of different wavelengths, and have a first thickness TH1. For example, the first reflecting layer RFT1 may include a first DBR and a second DBR. The first DBR may reflect light of a first wavelength of light, and the second DBR may reflect light of a second wavelength shorter than the first wavelength. For example, the first DBR may reflect light of 550 nm or 630 nm, and the second DBR may reflect light of 460 nm.

Figure 8A:
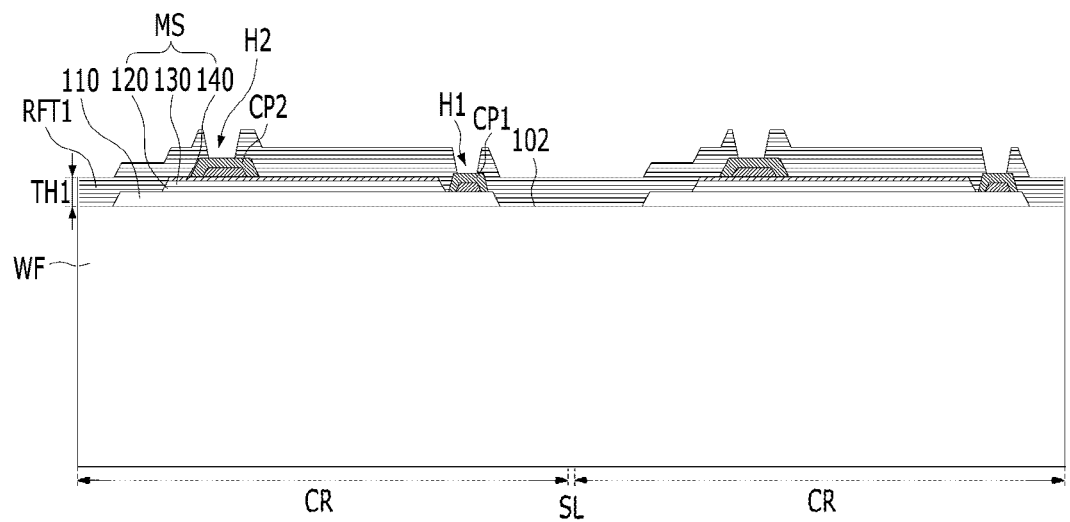
Figure 8B:
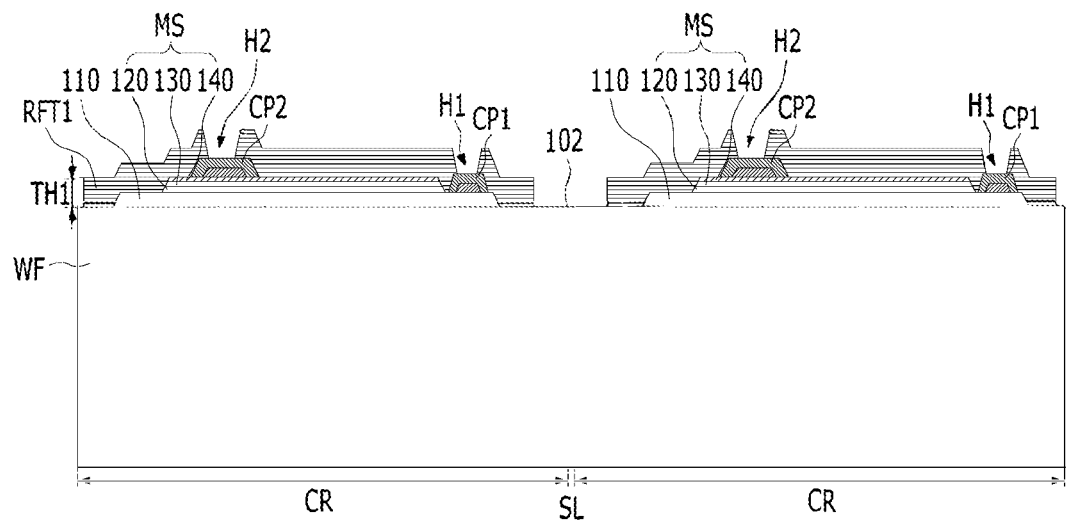

Referring to FIGS. 8A and 8B, the first reflecting layer RFT1 may be etched to form a first hole H1 which exposes the first conductive pattern CP1, and a second hole H2 which exposes the second conductive pattern CP2.

According to an exemplary embodiment, while the first and second holes H1 and H2 are formed, the first reflecting layer RFT1 formed on the scribe line SL may also be removed to expose the edge of each chip region CR. In particular, in order to prevent damage to the first reflecting layer RFT1 during a subsequent laser process for cutting the wafer WF, the first reflecting layer RFT1 formed at the scribe line SL and the chip region CR adjacent to the scribe line SL, e.g., the edge of the chip region CR, may be etched.

Figure 3A:
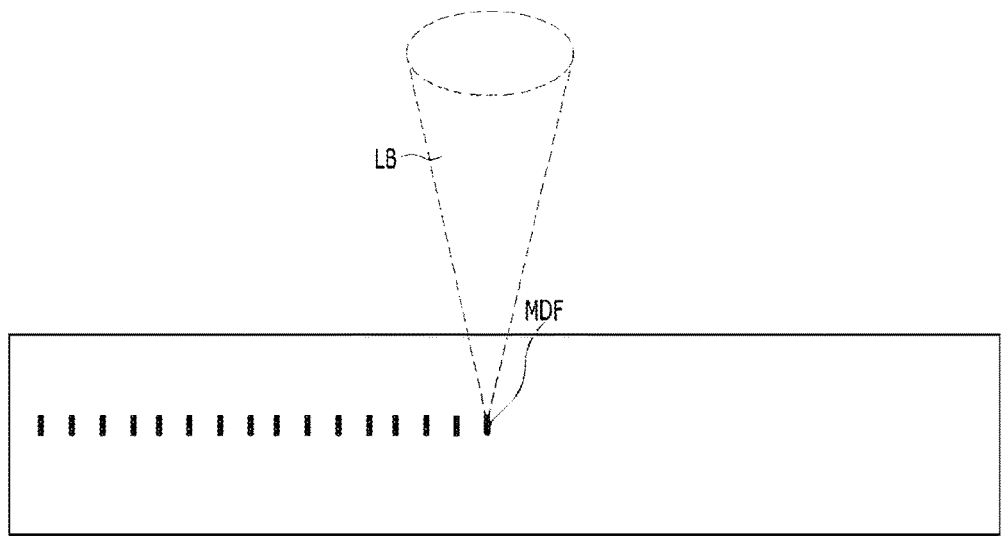
FIG. 3A is a schematic diagram illustrating a conventional method using laser to cut a wafer.
Figure 3B:
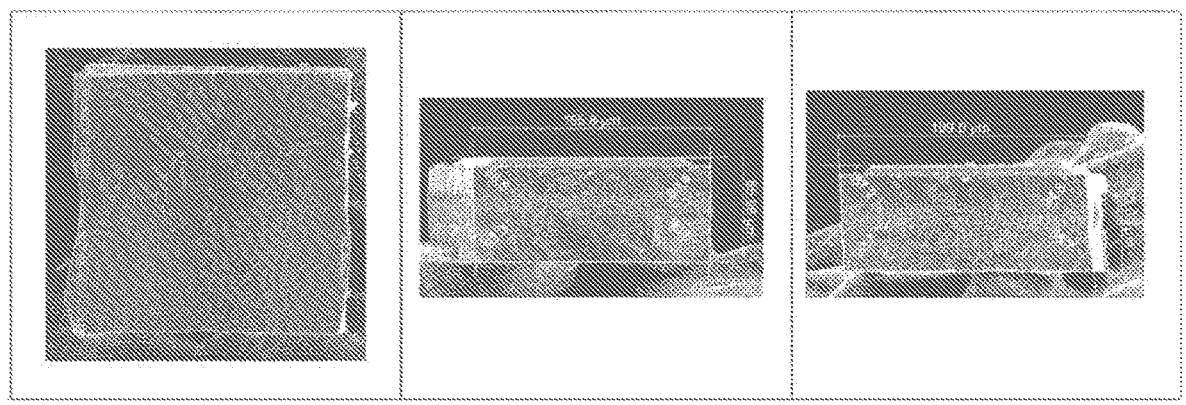
FIG. 3B shows photographs of a substrate which is cut according to the conventional method.

In some exemplary embodiments, the process of removing the first reflecting layer RFT1 around the scribe line SL may be omitted depending on the emission depth of laser beam LB. For example, when the emission depth of the laser beam LB (see FIG. 3A) is equal to the thickness of the polished wafer WF, the laser beam LB may have no influence on the first reflecting layer RFT1. In this case, the process of removing the first reflecting layer RFT1 around the scribe line SL may be omitted, as illustrated in FIG. 7.

Figure 9A:
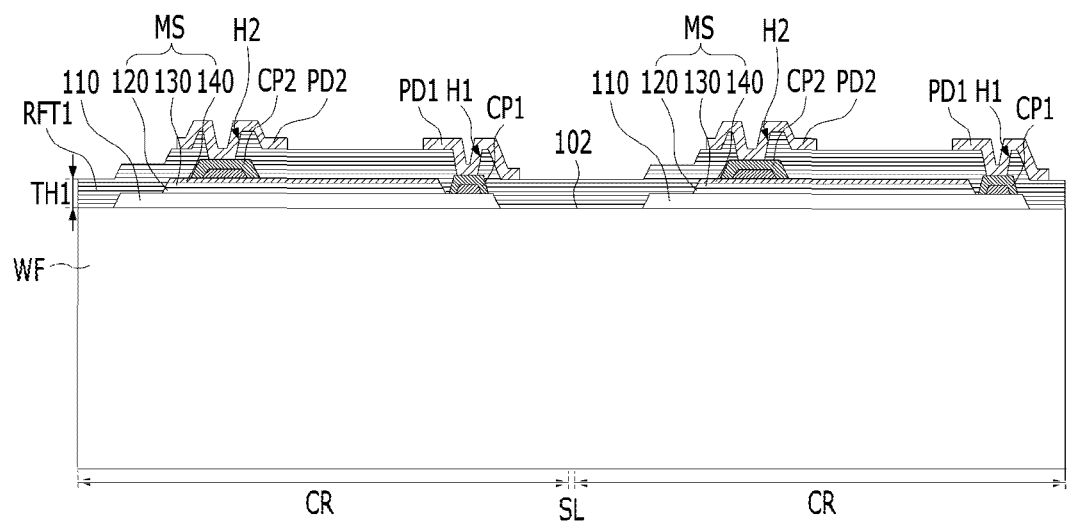
Figure 9B:
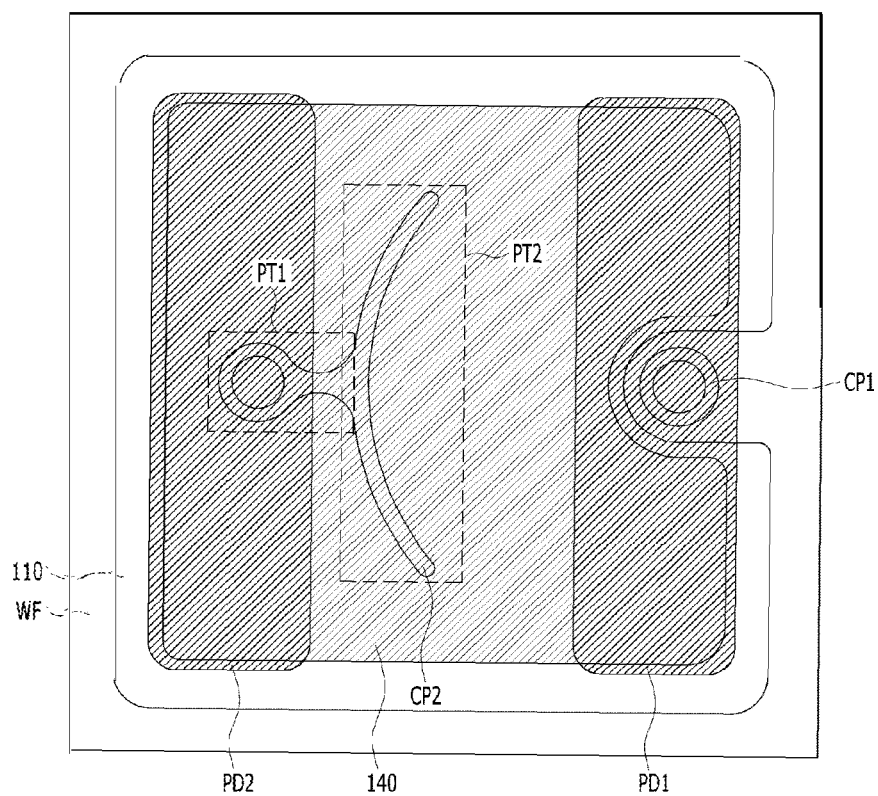

Referring to FIGS. 9A and 9B, a first pad PD1 and a second pad PD2 may be formed on the first reflecting layer RFT1 while filling the first and second holes H1 and H2, respectively.

For example, each of the first and second pads PD1 and PD2 may include at least one selected from the group consisting of aluminum (Al), nickel (Ni), titanium (Ti), and gold (Au). A pad layer may have a multilayer structure.

For example, the pad layer may be formed on the first reflecting layer RFT1 while filling the first and second holes H1 and H2. The pad layer may include the first pad PD1 and the second pad PD2, which may be formed through a lift-off process. The first pad PD1 may be electrically connected with the first conductive pattern CP1, and the second pad PD2 may be electrically connected with the second conductive pattern CP2.

In this manner, a plurality of light emitting structures may be formed on the wafer WF. The light emitting structures may be formed in the respective chip regions CR. FIG. 9B exemplarily illustrates a plan view of one light emitting structure.

Figure 10A:
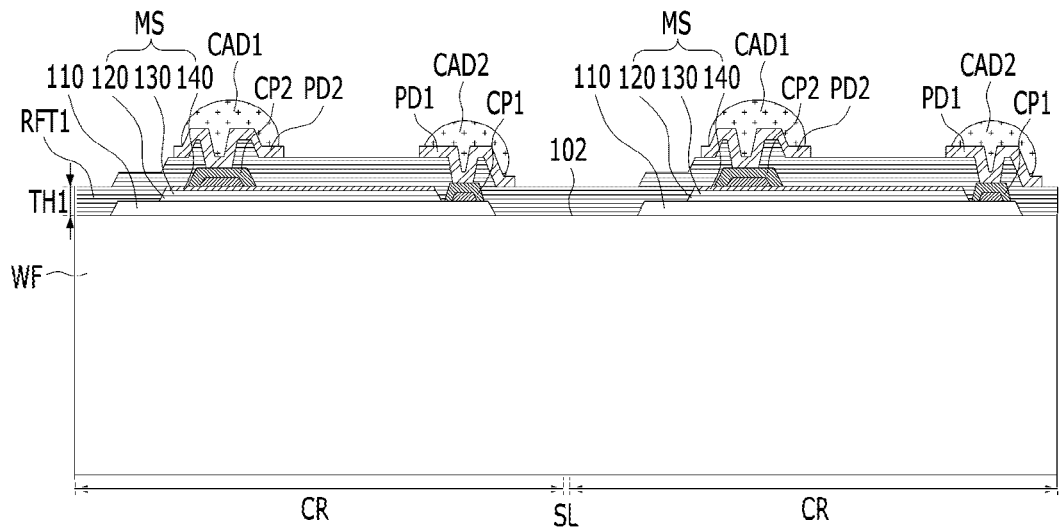
Figure 10B:
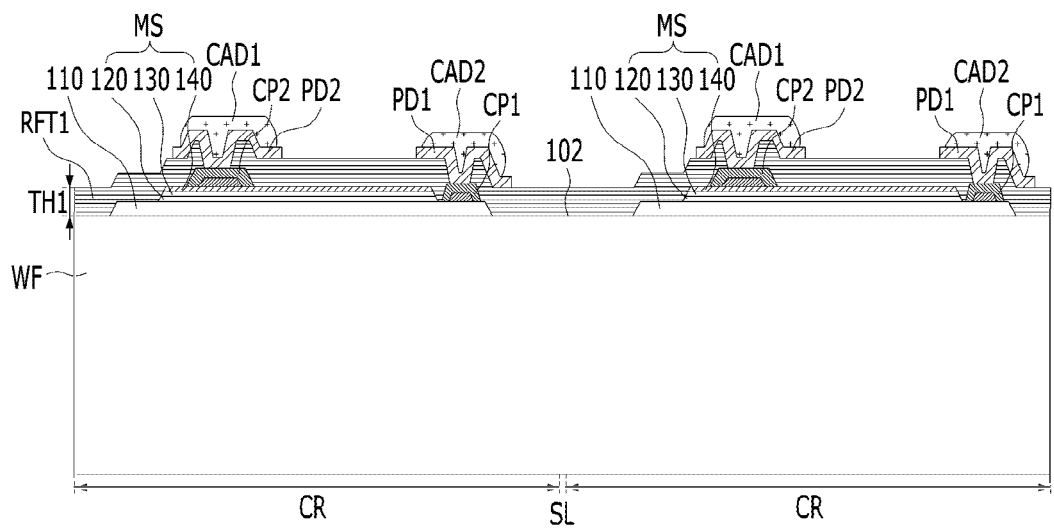

Referring to FIGS. 10A and 10B, a first conductive adhesion part CAD1 and a second conductive adhesion part CAD2 may be formed on the first pad PD1 and the second pad PD2, respectively.

According to an exemplary embodiment, the first conductive adhesion part CAD1 and the second conductive adhesion part CAD2 may be formed through a stencil. In particular, a stencil including openings may be aligned on the wafer WF to correspond to the first and second pads PD1 and PD2. The openings of the stencil may be filled with conductive adhesive layers, respectively, such that the first conductive adhesion part CAD1 which electrically adheres to the first pad PD1 and the second conductive adhesion part CAD2 which electrically adheres to the second pad PD2 may be formed. Each of the first and second conductive adhesion parts CAD1 and CAD2 may include at least one selected from the group consisting of indium (In), tin (Sn), nickel (Ni), and copper (Cu). Then, the stencil may be removed, and a reflow process may be performed on the first and second conductive adhesion parts CAD1 and CAD2. The first conductive adhesion part CAD1 may have a first surface abutting the first pad PD1 and facing one surface 102 of the wafer WF, and a second surface opposite to the first surface.

As shown in FIG. 10A, the second surface of the first conductive adhesion part CAD1 may have a curved surface according to an exemplary embodiment. The second conductive adhesion part CAD2 may have a first surface abutting the second pad PD2 and facing the one surface 102 of the wafer WF, and a second surface opposite to the first surface 102. The second surface of the second conductive adhesion part CAD2 may have a curved surface.

According to another exemplary embodiment, the tops of the first and second conductive adhesion parts CAD1 and CAD2 may be etched so that the second surfaces of the first and second conductive adhesion parts CAD1 and CAD2 may have substantially flat surfaces, as shown in FIG. 10B. Hereafter, the first and second conductive adhesion parts CAD1 and CAD2 will exemplarily be described as having the configurations shown in FIG. 10B.

In some exemplary embodiments, the process of forming the first and second conductive adhesion parts CAD1 and CAD2 may be omitted.

Figure 11:
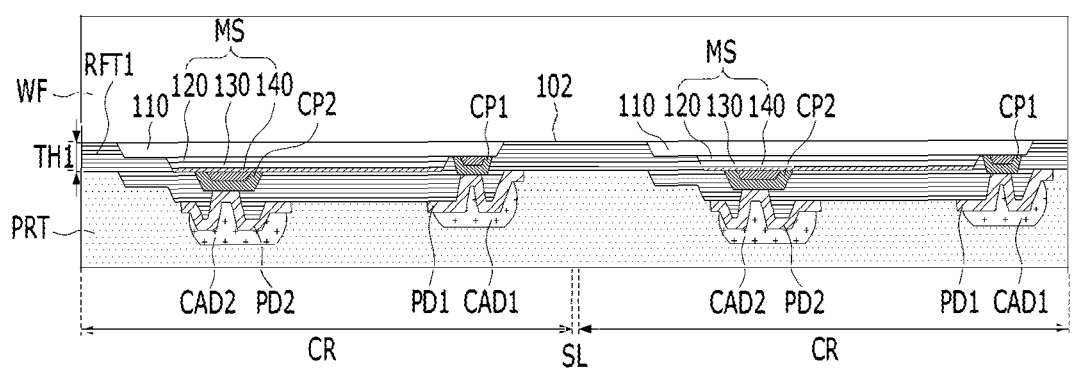

Referring to FIG. 11, one surface 102 of the wafer WF may be covered with a protective film PRT to protect the light emitting structures. The protective film PRT may be temporarily bonded to the light emitting structures through an attachable/detachable adhesive.

Then, the wafer WF may be turned upside down, and grinding and polishing processes may be performed on the other surface of the wafer opposite to the one surface 102 to reduce the thickness of the wafer WF.

During the grinding and polishing processes, the protective film PRT may protect the light emitting structures, and prevent particles generated during the wafer polishing process from penetrating into the light emitting structures.

In the illustrated exemplary embodiment, the first and second conductive adhesion parts CAD1 and CAD2 are exemplarily described as being formed before and the grinding and polishing processes are performed on the other surface of the wafer WF. However, the inventive concepts are not limited thereto, and in some exemplary embodiments, the first and second conductive adhesion parts CAD1 and CAD2 may be formed after the other surface of the wafer WF is ground and polished.

Figure 12:
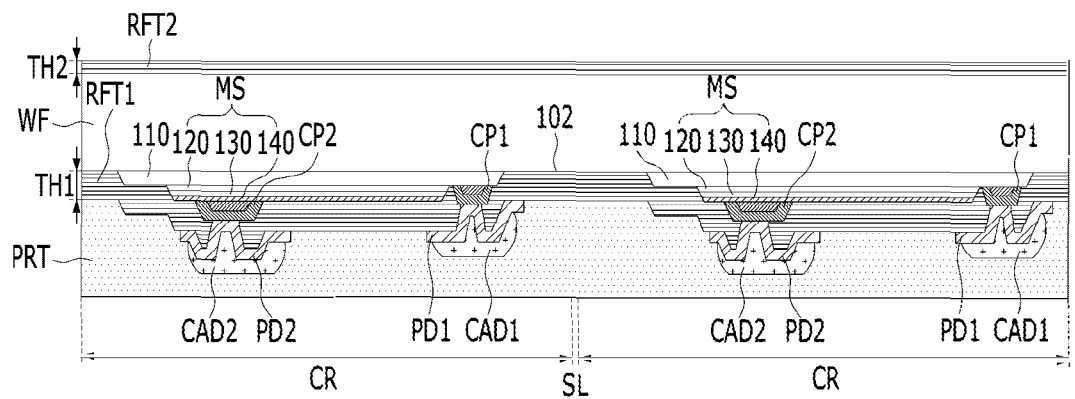

Referring to FIG. 12, a second reflecting layer RFT2 may be formed on the polished surface of the wafer WF.

The second reflecting layer RFT2 may include a DBR having a structure in which silicon oxide ($SiO_2$) and titanium oxide ($TiO_2$) are alternately stacked. In an exemplary embodiment, the second reflecting layer RFT2 may have a second thickness TH2 less than the first thickness TH1 of the first reflecting layer RFT1. The second reflecting layer RFT2 may reflect light of a second wavelength.

Figure 13:
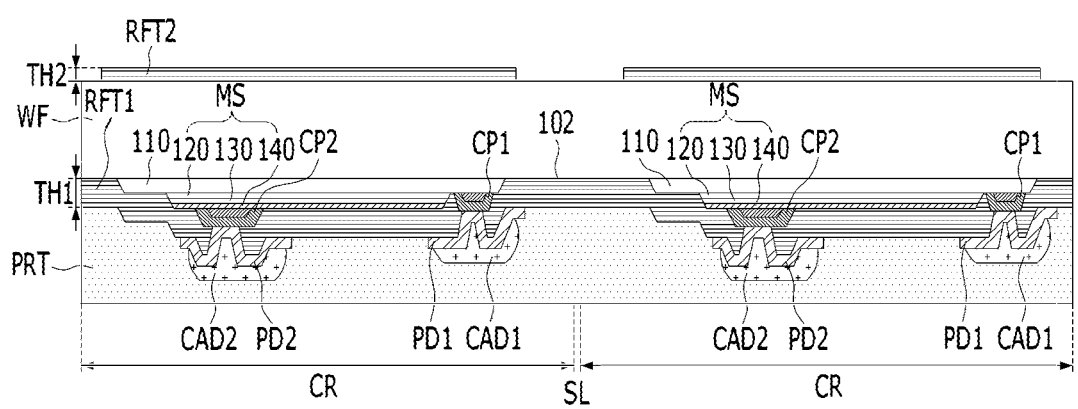
Figure 14A:
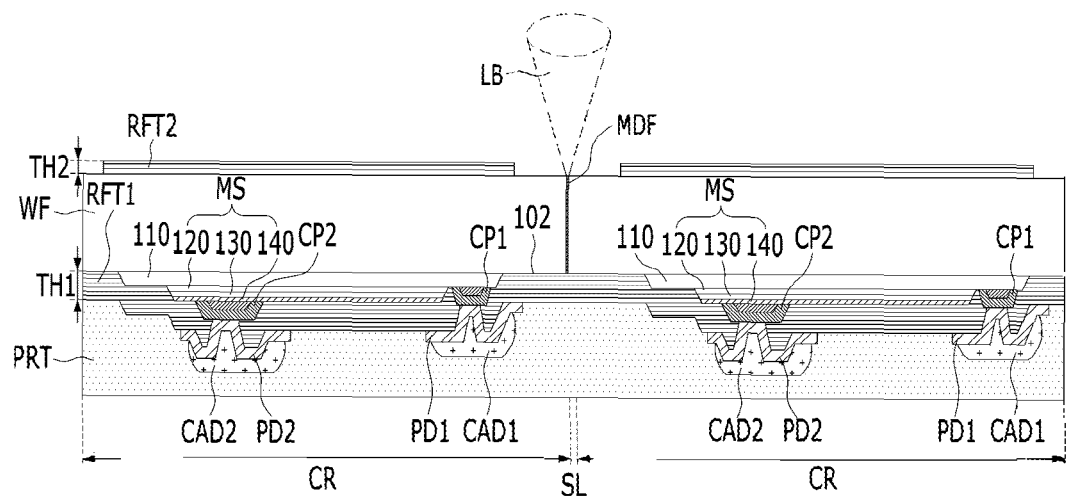
Figure 14B:
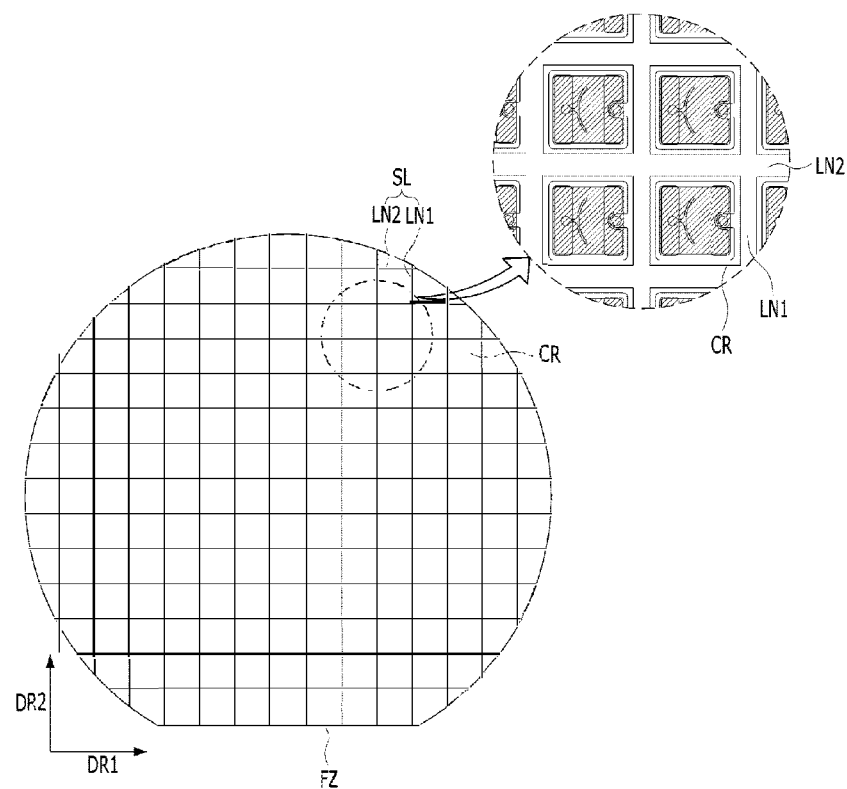

Referring to FIG. 13, the second reflecting layer RFT2 formed on the scribe line SL may be etched to expose the edge of each chip region CR.

The second reflecting layer RFT2 formed on the scribe line SL may be etched to prevent damaging the second reflecting layer RFT2 during a subsequent laser emitting process for cutting the wafer WF. For example, a portion of the second reflecting layer RFT2 formed in the chip region CR adjacent to the scribe line SL, e.g., the edge of the chip region CR, may be partially etched.

Referring to FIGS. 14A, 14B, 16A and 16B, modified regions MDF may be formed by emitting the laser beam LB along the scribe line SL of the wafer WF. The modified regions MDF may include first modified regions MDF1 formed in the first direction DR1 and second modified regions MDF2 formed in the second direction DR2.

According to an exemplary embodiment, the laser beam LB may be emitted through femto-second laser having an ultra short pulse width of several to several hundreds of $10^{-15}$ seconds (femto-seconds). When the femto-second laser having the short pulse width and high peak power is used, the emission time of the laser pulse may be shorter than a thermal diffusion time in the wafer WF, which enables non-thermal processing without thermal degradation of the material within the wafer WF. Since the femto-second laser generates high peak power by using a smaller amount of energy than existing continuous-wave laser or nano-second laser, an impact to the wafer WF may be reduced. Furthermore, since the femto-second laser has a nonlinear optical effect, such as a multi-photon absorption, the femto-second laser may be used for a width less than the diffraction limit of laser beam.

The multi-photon absorption will be briefly described as follow. When the energy hv of photon is less than the absorption band gap EG of a material, the material becomes optically transparent. As such, an absorption occurs in the material when the energy hv of photon is greater than the absorption bad gap EG (hv>EG). However, even when the material is in optically transparent, the absorption may occur when the strength of the laser beam LB is very high (nhv>EG, where n is a natural number equal to or greater than 2). This phenomenon is referred to as the multi-photon absorption. In the case of a pulse wave, the strength of the laser beam LB is determined by the peak power density (W/cm$^2$) of the laser beam LB. For example, the multi-photon absorption occurs when the peak power density is $1\times10^8$ W/cm$^2$.

According to an exemplary embodiment, the first modified regions MDF1 may be formed by emitting the laser beam LB along the first lines LN1 of the scribe line SL. The laser beam LB may be continuously emitted in the thickness direction of the wafer WF, and be shifted by a first isolation distance to continuously emit the laser beam LB in the first direction DR1. The first modified regions MDF1 may be formed in a lined shape, in which the first modified regions MDF1 are continuously extended in the thickness direction of the wafer WF, and be spaced apart from each other by the first isolation distance.

The second modified regions MDF2 may be formed by emitting the laser beam LB along the second lines LN2 of the scribe line SL. The laser beam LB may be continuously emitted in the thickness direction of the wafer WF, and be shifted by a second isolation distance to continuously emit the laser beam LB in the second direction DR2. The second modified regions MDF2 may be formed in a lined shape, in which the second modified regions MDF2 are continuously extended in the thickness direction of the wafer WT, and be spaced apart from each other by the second isolation distance less than the first isolation distance.

The laser beam emitting process may be performed more densely and more frequently in the second direction DR2 than in the first direction DR1. As such, the number of the second modified regions MDF2 may be greater than the number of the first modified regions MDF1, and the second modified regions MDF2 may be formed more densely than the first modified regions MDF1. For example, the second modified regions MDF2 may overlap one another.

Since a surface cut in the second direction DR2 and exposed to the outside includes an m-plane, and since the m-plane is a crystal plane of a lattice structure, it may be easier to cut the wafer WF in the second direction DR2 than in the first direction DR1.

As described above, however, the inclined m-plane may be formed when the ingot is cut to fabricate the wafer WF. In particular, when the ingot is more quickly cut in the second direction DR2 than in the first direction DR1 as in the related art, the exposed m-plane may be inclined with respect to the one surface 102 of the wafer WF. As such, the laser beam LB according to an exemplary embodiment is not only more densely and more frequently emitted in the second direction DR2, but is also continuously emitted in the thickness direction of the wafer WF. In this manner, the second modified regions MDF2 according to an exemplary embodiment may be formed perpendicular to the one surface 102 of the wafer WE.

According to an exemplary embodiment, the width between the first modified regions MDF1 and the width between the second modified regions MDF2 may be adjusted by the emission speed of the femto-second laser. While the wafer WF is fixed, the speed at which the femto-second laser is emitted in the first direction DR1 may be adjusted to a higher speed than the speed at which the femto-second laser is emitted in the second direction DR2, in order to determine the first isolation distance and the second isolation distance. As another example, while the femto-second laser is fixed, the speeds at which the wafer WF is moved in the first and second directions DR1 and DR2 may be set differently to adjust the first and second isolation distances.

The first and second reflecting layers RFT1 and RFT2 may each include a DRB, and the DBR may be damaged by the laser beam LB. As such, the second reflecting layer RFT2 disposed on the other surface of the wafer WF, i.e., the surface onto which the laser beam LB is emitted, may be removed along the scribe line SL to prevent damage to the second reflecting layer RFT2 while the laser beam LB is emitted.

In an exemplary embodiment, the process of removing the first reflecting layer RFT1 along the scribe line SL may be omitted when the emission depth of the laser beam LB accurately coincides with the thickness of the wafer WF. However, the inventive concepts are not limited thereto, and when the emission depth of the laser beam LB is greater than the thickness of the wafer WF in another exemplary embodiment, the process of removing the first reflecting layer RFT1 along the scribe line SL may be performed.

Referring to FIGS. 15A, 15B, 16A, and 16B, an expansion tape EXT may be bonded to the other surface of the wafer WF on which the laser beam emission process has been performed. The expansion tape EXT may be temporarily bonded to the other surface of the wafer WF through an attachable/detachable adhesive.

After the expansion tape EXT is bonded, the protective film PRT may be removed to expose the light emitting structures on the one surface 102 of the wafer WF.

The expansion tape EXT may be expanded toward an end of the wafer WF such that the wafer WF irradiated with the laser beam LB along the scribe line SL may be singularized (or ruptured) to form a plurality of light emitting chips LEC. The plurality of light emitting chips LEC may be spaced apart from each other in the first and second directions DR1 and DR2.

Figure 16A:
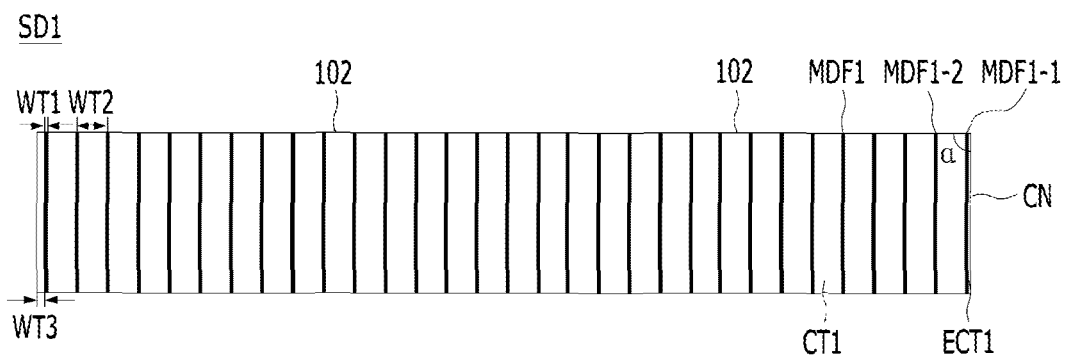
Figure 16B:
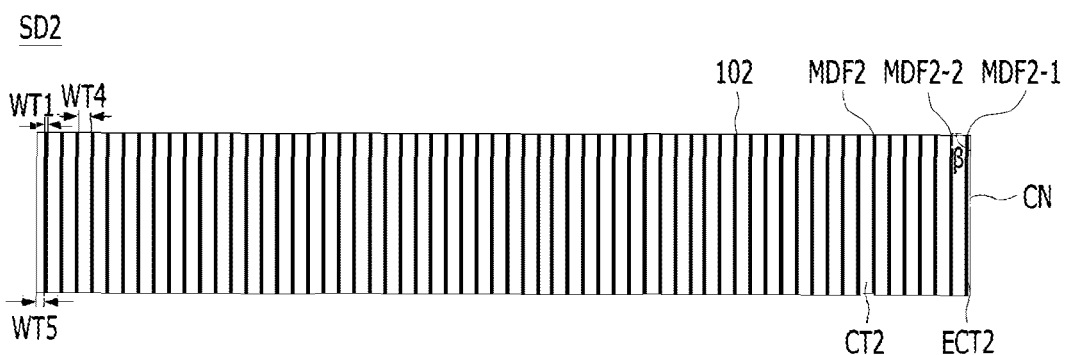

Each of the light emitting chips LEC may include a substrate SUB and a light emitting structure disposed on one surface 102 of the substrate SUB. The substrate SUB may have the same size as the chip region CR, and include first side surfaces SD1 and second side surfaces SD2. The first side surfaces SD1 may be cut in the first direction DR1 so as to face each other, and the second side surfaces SD2 may be cut in the second direction DR2 so as to face each other. FIG. 16A is a schematic sectional view of the first side surface SD1 of the substrate SUB in one light emitting chip LEC. Referring to FIG. 16A, each of the first side surfaces SD1 may have an angle α of 88.5° to 91.5° with respect to the one surface 102 of the substrate SUB. FIG. 16B is a schematic sectional view of the second side surface SD2 of the substrate SUB in one light emitting chip LEC. Referring to FIG. 16B, each of the second side surfaces SD2 may have an angle β of 88.5° to 91.5° with respect to the one surface 102 of the substrate SUB. More particularly, the first side surfaces SD1 and the second side surfaces SD2 of the substrate SUB may be substantially perpendicular to the one surface 102 of the substrate SUB.

Figure 15A:
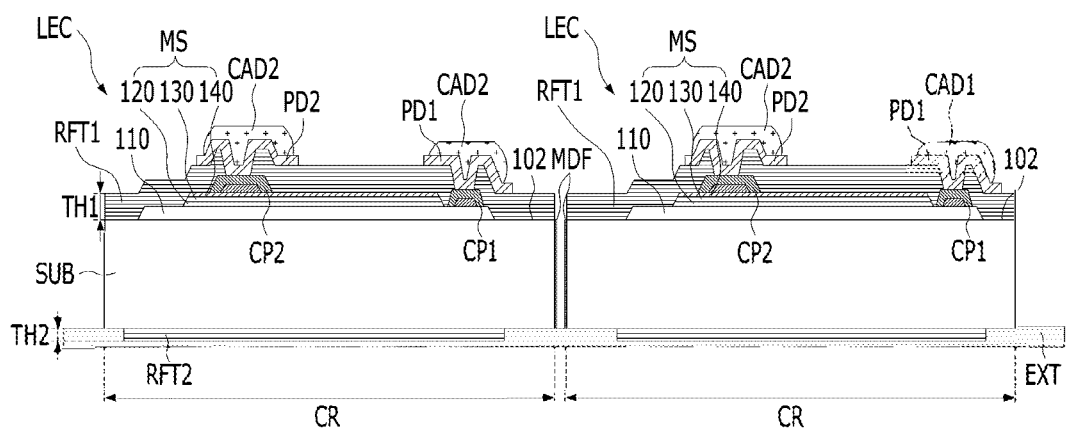
Figure 15B:
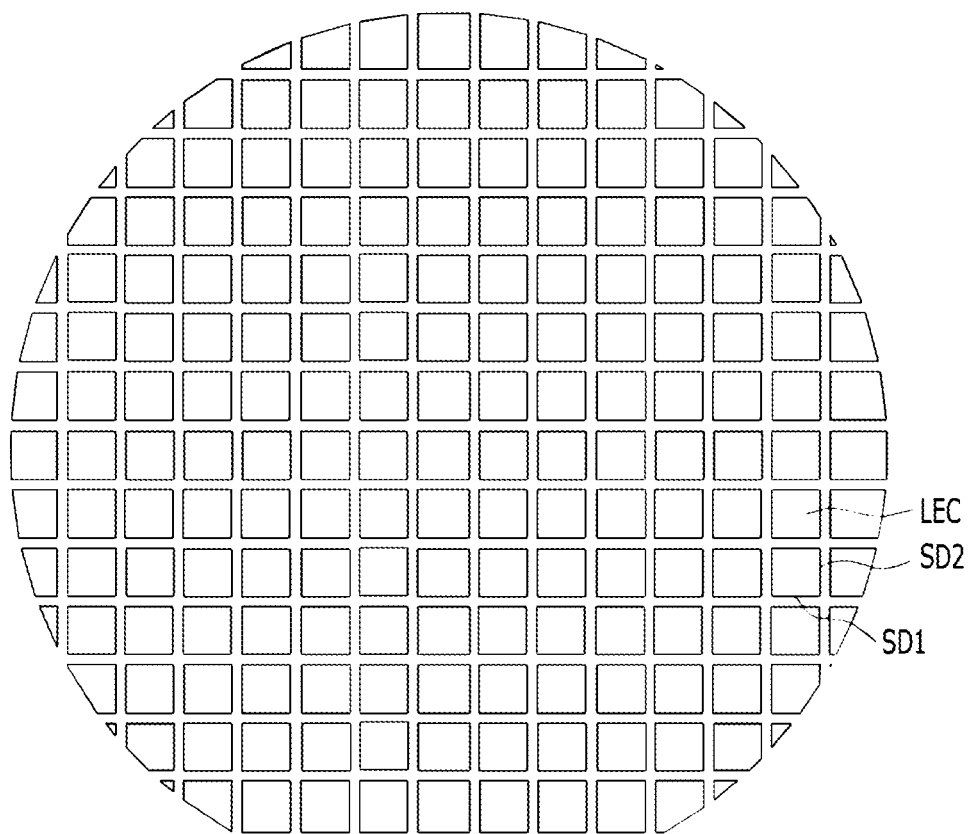

According to an exemplary embodiment, referring to FIGS. 15B and 16A, the surfaces cut in the first direction DR1 may include an a-plane group. Each of the first side surfaces SD1 cut in the first direction DR1 may include the first modified regions MDF1 and first ruptured regions CT1 disposed between the respective first modified regions MDF1. The first modified regions MDF1 may be portions modified by the laser beam LB, and the first ruptured regions CT1 may be portions physically cut by the expansion of the expansion tape EXT. As described above, the first modified regions MDF1 may be continuously formed in the thickness direction of the wafer WF. As such, the first ruptured regions CT1 which are physically cut may also be continuously extended in the thickness direction of the wafer WF (and thus, in the thickness direction of the substrate SUB) thereby having a lined shape. The first modified region MDF1 may have a first width WT1, and the first ruptured region CT1 may have a second width WT2 greater than the first width WT1. As described above, the neighboring first modified regions MDF1 may be spaced apart from each other by the first isolation distance. As such, the second width WT2 may be equal to the first isolation distance.

Hereinafter, a plane at which an end of the first side surface SD1 and an end of the second side surface SD2 of the substrate SUB meet each other is referred to as a corner CN. In addition, the point at which the one surface 102, the first side surface SD1, and the second side surface SD2 of the substrate meet one another is referred to as a corner point.

According to an exemplary embodiment, each of the first ruptured regions CT1 may include a first cut region ECT1 at the corner CN. More particularly, the first modified regions MDF1 may include a first-first modified region MDF1-1 and a first-second modified region MDF1-2. The first-first modified region MDF1-1 may be disposed closest to the corner CN, and the first-second modified region MDF1-2 may be disposed next to the first-first modified region MDF1-1. The first cut region ECT1 may correspond to a section between the corner CN and the first-first modified region MDF1-1. The width between the corner CN and the first-first modified region MDF1-1 may be less than the width between the first-first modified region MDF1-1 and the first-second modified region MDF1-2. For example, the first cut region ECT1 may have a third width WT3 less than the second width WT2. The first cut region ECT1 may be a section that may be separated from the first ruptured region CT1 at a portion adjacent to the corner CN while the wafer WF is physically ruptured by emitting the laser beam LB in the first direction DR1.

Referring to FIGS. 15B and 16B, the surfaces cut in the second direction DR2 may include an m-plane group. The second side surfaces SD2 cut in the second direction DR2 may include the second modified regions MDF2 and second ruptured regions CT2 disposed between the respective second modified regions MDF2. The second modified regions MDF2 may be portions modified by the laser beam LB, and the second ruptured regions CT2 may be portions physically cut by the expansion of the expansion tape EXT. As described above, each of the second modified regions MDF2 may be continuously formed in the thickness direction of the wafer WF. As such, the second ruptured regions CT2 which are physically ruptured may also be continuously extended in the thickness direction of the wafer WF (and thus, in the thickness direction of the substrate SUB), thereby having a lined shape. The second modified region MDF2 may have the first width WT1, and the second ruptured region CT2 may have a fourth width WT4 greater than the first width WT1. As described above, the neighboring second modified regions MDF2 may be spaced apart from each other by the second isolation distance. As such, the fourth width WT4 may be equal to the second isolation distance.

According to an exemplary embodiment, each of the second ruptured regions CT2 may include a second cut region ECT2 at the corner CN. More particularly, the second modified regions MDF2 may include a second-first modified region MDF2-1 and a second-second modified region MDF2-2. The second-first modified region MDF2-1 may be disposed the closest to the corner CN, and the second-second modified region MDF2-2 may be disposed next to the second-first modified region MDF2-1. The second cut region ECT2 may correspond to a section between the corner CN and the second-first modified region MDF2-1. The width between the corner CN and the second-first modified region MDF2-1 may be less than the width between the second-first modified region MDF2-1 and the second-second modified region MDF2-2. For example, the second cut region ECT2 may have a fifth width WT5 less than the fourth width WT4. The second cut region ECT1 may be a section separated from the second ruptured region CT2 at a portion close to the corner CN while the wafer WF onto which the laser beam LB has been emitted is physically ruptured in the second direction DR2.

According to an exemplary embodiment, the modified regions MDF may have a lined shape and pass through the substrate SUB, and include the first modified regions MDF1 and the second modified regions MDF2. The first modified regions MDF1 may be spaced apart from each other in the first direction DR1 by the first width WT1, and the second modified regions MDF2 may be spaced apart from each other in the second direction DR2 by the second width WT2. In particular, as the second modified regions MDF2 are formed more densely than the first modified regions MDF1, the m-plane exposed in the second direction DR2 may be formed perpendicular to the one surface 102 of the substrate SUB.

Figure 17A:
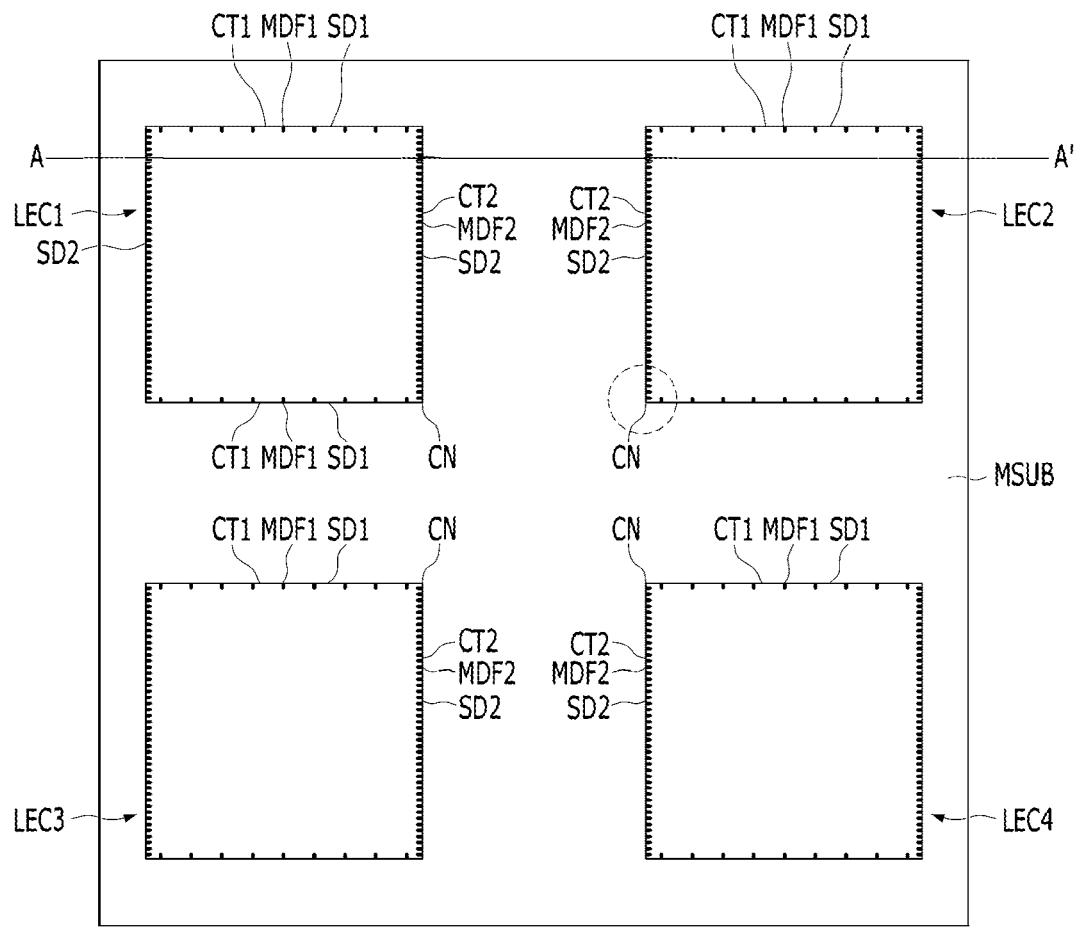
Figure 17B:
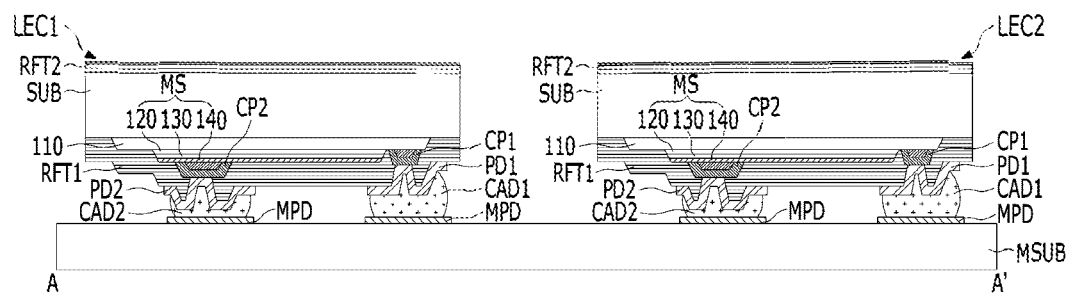

According to an exemplary embodiment, the light emitting chip LEC may include the substrate SUB, the light emitting structure formed on the one surface 102 of the substrate SUB, and the second reflecting layer RFT2 formed on the other surface of the substrate SUB. The light emitting structure may include the first conductive type semiconductor layer 110, the mesa structure MS, the first conductive pattern CP1, the second conductive pattern CP2, the first reflecting layer RFT1, the first pad PD1, and the second pad PD2. The first conductive type semiconductor layer 110 may be formed on the one surface 102 of the substrate SUB, and have a width less than the width of the substrate SUB. The mesa structure MS may be formed on the first conductive type semiconductor layer 110, and have a width less than the width of the first conductive type semiconductor layer 110. The mesa structure MS may include the active layer 120, the second conductive type semiconductor layer 130, and the ohmic layer 140. In this case, the other surface of the substrate SUB in the light emitting chip LEC may function as a light extraction surface. Most of light emitted from the active layer 120 of the light emitting chip LEC may be reflected toward the substrate SUB by the first reflecting layer RFT1, and a fraction of light may be reflected toward the light emitting structure by the second reflecting layer RFT2. As such, 20 to 30% of light generated by the active layer 120 in the light emitting chip LEC may be discharged through the light extraction surface. The remaining light, e.g., 70 to 80% of light, may be emitted through the first side surfaces SD1 and the second side surfaces SD2 of the substrate SUB Referring to FIGS. 17A and 17B, the light emitting chips LEC may be picked up and mounted on a mounting substrate MSUB to form a light emitting module. FIG. 17B is a cross-sectional view taken along line A-A' of the light emitting chips of FIG. 17A.

Since the first side surfaces SD1 and the second side surfaces SD2 of the substrate SUB are substantially perpendicular to the one surface 102 of the substrate SUB, the light emitting chips LEC may be prevented from being rotated during the pick up and mounting process, nor the light emitting chips LED would fall down even after being mounted on the mounting substrate MSUB.

The first and second conductive adhesion parts CAD1 and CAD2 in each of the light emitting chips LED mounted on the mounting substrate MSUB may be electrically bonded to mounting pads MPD of the mounting substrate MSUB, respectively. For example, as illustrated in FIGS. 10A and 10B, the first and second conductive adhesion parts CAD1 and CAD2 may be formed on the light emitting chip LEC. As another example, the first conductive adhesion part CAD1 and the second conductive adhesion part CAD2 may be formed on the respective mounting pads MPD of the mounting substrate MSUB. As still another example, the first and second conductive adhesion parts CAD1 and CAD2 may be formed on the light emitting chip LEC, and third and fourth conductive adhesion parts may be further formed on the respective mounting pads MPD, such that the first conductive adhesion part CAD1 is electrically contacted with the third conductive adhesion part, and the second conductive adhesion part CAD2 is electrically contacted with the fourth conductive adhesion part.

According to an exemplary embodiment, when the thickness of each of the light emitting chips LEC is relatively large than the area thereof, the light emitting chip LEC may fall down even when the first side surfaces SD1 and the second side surfaces SD2 of the substrate SUB in the light emitting chip LEC are substantially perpendicular to the one surface 102 of the substrate SUB. As such, when the light emitting chip LEC has an area of 40,000 $\mu m^2$ or less, the thickness of the light emitting chip LEC may be formed to be less than about half of a length of one side thereof. For example, when the width and length of the light emitting chip LEC are each 200 μm, the light emitting chip LEC may have a thickness of 100 μm or less.

Furthermore, light generated from the active layer 120 may be scattered at the first modified regions MDF1 of the first side surfaces SD1 and the second modified regions MDF2 of the second side surfaces SD2 in the substrate SUB of each of the light emitting chips LEC, which may improve the light extraction efficiency of the light emitting chips LEC.

In the illustrated exemplary embodiment, the light emitting chips LEC may include a first light emitting chip LEC1, a second light emitting chip LEC2, a third light emitting chip LEC3, and a fourth light emitting chip LEC4. The first to fourth light emitting chips LEC1 to LEC4 may have substantially the same structure.

As described above, the light emitting chips LEC according to an exemplary embodiment may not be rotated during the pick up and the transfer processes. As such, side surfaces of the light emitting chips LEC that face each other on the mounting substrate MSUB may have the same structure. For example, one of the first side surfaces SD1 of the substrate SUB of the first light emitting chip LEC1 may face one of the first side surfaces SD1 of the substrate SUB of the second light emitting chip LEC2, and one of the second side surfaces SD2 of the substrate SUB of the first light emitting chip LEC1 may face one of the second side surfaces SD2 of the substrate SUB of the third light emitting chip LEC3.

Furthermore, the respective corners of the first to fourth light emitting chips LEC1 to LEC4 face each other. As described above, the first and second cut regions ECT1 and ECT2 are formed at each of the corners. The first cut region ECT1 has a width less than the first ruptured regions CT1, and the second cut region ECT2 has a width less than the second ruptured regions CT2, such that the modified regions MDF are disposed close to the corner. In this manner, the modified regions MDF at the respective corners facing each other may prevent total reflection of light, thereby improving the light extraction efficiency.

In general, light generated from the active layer 120 of the light emitting chip is absorbed, reflected, and dissipated while passing through the light emitting structure and the substrate SUB that does not include the second reflecting layer RFT2, and then emitted through the other surface of the substrate SUB. When the total amount of light emitted through the other surface of the substrate SUB that does not include the second reflecting layer RFT2 is considered as 100%, the amount of light emitted through the other surface of the substrate SUB by the first and second reflecting layers RFT1 and RFT2 in the light emitting chip according to an exemplary embodiment may be about 20 to 30%. The remainder of light, e.g., about 70 to 80% of the total amount of light, may be emitted through the first side surfaces SD1 and the second side surfaces SD2 of the substrate SUB.

Since the amount of light emitted in the horizontal direction is greater than the amount of light emitted in the vertical direction, the light emitting chips LEC according to an exemplary embodiment may have uniform luminance. As such, the light emitting chips LEC may be used in a back light unit (BLU), which requires uniform luminance.

Hereinafter, a wafer cut by the process according to an exemplary embodiment will be described.

Figure 18A:
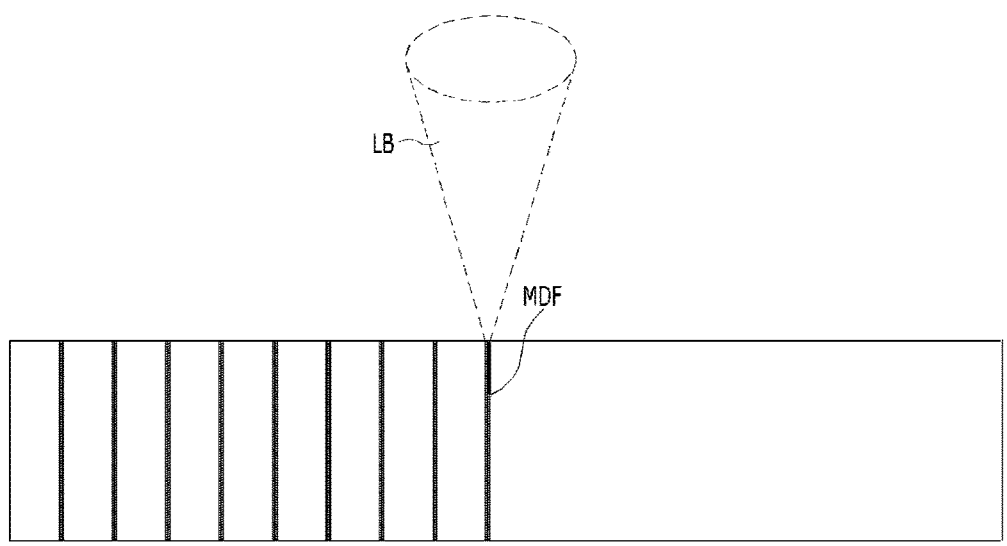
FIG. 18A is a schematic diagram illustrating a method cutting a wafer using laser.

FIG. 18A is a schematic diagram illustrating a method of cutting the wafer using laser according to an exemplary embodiment.

Figure 2:
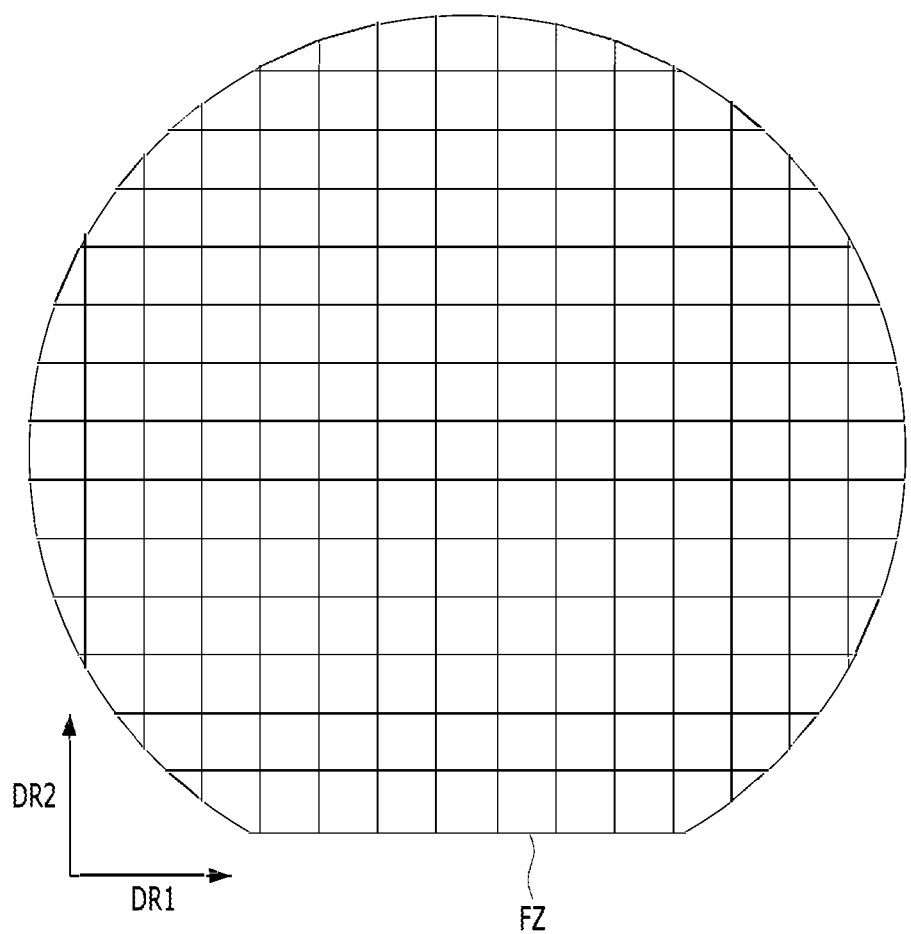
FIG. 2 is a cross-sectional view of the wafer shown in FIG. 1.

First, a wafer is prepared, which has an m-axis direction set as a first direction parallel to an extension direction of a flat zone (see FIG. 2), and an a-axis direction set as a second direction perpendicular to the first direction. A substrate formed by cutting the wafer has a size of 200 μm×200 μm×85 μm.

Referring to FIG. 18A, line-shaped modified regions MDF are formed by successively emitting laser beams LB in the thickness direction of the wafer. The laser beams LB form the modified regions MDF, which are spaced apart from each other by a first isolation distance in the first direction, and by a second isolation distance in the second direction less than the first isolation distance. When the wafer having the line-shaped modified regions formed therein is ruptured, ruptured regions which are continuously extended in the thickness direction are formed between the respective modified regions, and cut into a plurality of substrates.

Figure 18B:
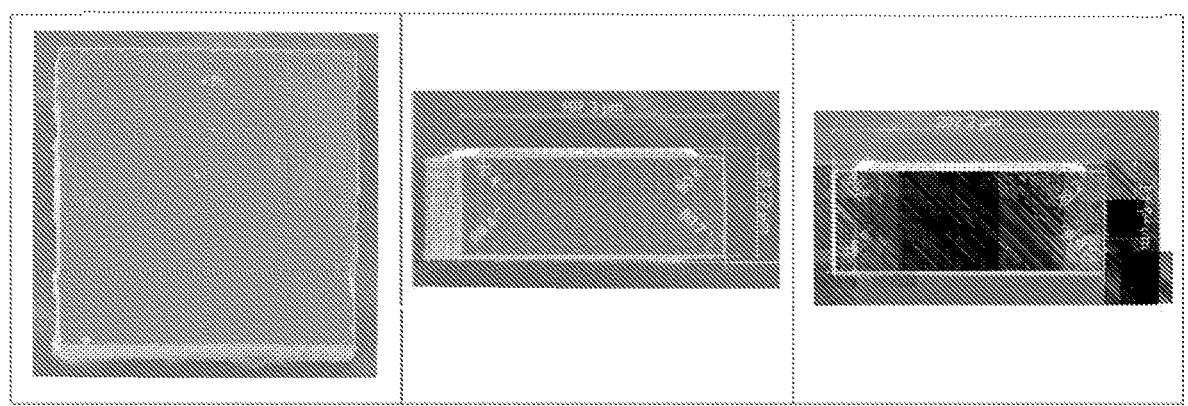
FIG. 18B shows photographs of a substrate formed through the method described with reference to FIG. 18A.

FIG. 18B shows photographs of a substrate formed through the method described with reference to FIG. 18A. In FIG. 18B, the left photograph is a photograph of the top surface of the substrate, the middle photograph is a photograph obtained by tilting a first side surface of the wafer cut in the first direction, and the right photograph is a photograph of a second side surface of the wafer cut in the second direction. A left portion of the middle photograph shows a part of the second side surface.

FIG. 18B shows that the cut substrate is substantially perpendicular. The angles between the top surface of the substrate and the first and second side surfaces may be substantially perpendicular in a range of 88.9° to 90.6°. Furthermore, the modified regions and the ruptured regions are parallel to the thickness direction of the substrate.

According to exemplary embodiments, the light emitting chip may have substantially vertical side surfaces. As such, when the light emitting chip is picked up and transferred, the light emitting chip may be prevented from being rotated or falling down at the transferred position. In addition, the reflecting layers may be disposed at the top and bottom of the light emitting chip, and the light emitting chip having vertical side surfaces may uniformly emit light through the side surfaces.

Although certain exemplary embodiments and implementations have been described herein, other embodiments and modifications will be apparent from this description. Accordingly, the inventive concepts are not limited to such embodiments, but rather to the m broader scope of the appended claims and various obvious modifications and equivalent arrangements as would be apparent to a person of ordinary skill in the art.

What is claimed is:

1. A light emitting module comprising:
a mounting substrate;
a plurality of light emitters disposed on the mounting substrate and including a first light emitter and a second light emitter; and
a plurality of pads disposed between the light emitters and the mounting substrate,
wherein the first light emitter includes a first substrate and a first light emitting layer disposed on a first surface of the first substrate,
wherein the second light emitter includes a second substrate and a second light emitting layer disposed on a second surface of the second substrate,
wherein the first substrate and the second substrate include a first side surface extending in a first direction and a second side surface extending in a second direction, the first and second directions crossing each other,
wherein the first side surface of the first substrate includes a first modified region formed in the first direction, and the second side surface of the second substrate includes a second modified region formed in the second direction,
wherein the first modified region includes a region having a width that is different from a width of the second modified region,
wherein the first modified region includes first sub modified regions and first isolation regions disposed between the first sub modified regions, and
wherein one of the first isolation regions has a first isolation distance.

2. The light emitting module of claim 1, wherein the second modified region includes second sub modified regions and second isolation regions disposed between the second sub modified regions, and
wherein one of the second isolation regions has a second isolation distance.

3. The light emitting module of claim 2, wherein the second isolation distance is less than the first isolation distance.

4. The light emitting module of claim 2, wherein the second modified region is formed more densely than the first modified region.

5. The light emitting module of claim 4, wherein the second sub modified regions overlap one another.

6. The light emitting module of claim 2, further comprising first ruptured regions disposed between the first sub modified regions.

7. The light emitting module of claim 6, wherein the first ruptured regions include a region having a width that is greater than a width of one of the first sub modified regions.

8. A light emitting module comprising:
a mounting substrate;
a plurality of light emitters disposed on the mounting substrate and including a first light emitter and a second light emitter; and
a plurality of pads disposed on the mounting substrate and electrically connected to the light emitters,
wherein the first light emitter includes a first substrate and a first light emitting layer disposed on the first substrate,
wherein the second light emitter includes a second substrate and a second light emitting layer disposed on the second substrate,
wherein the first substrate includes a first side surface extending in a first direction, and the second substrate includes a second side surface extending in a second direction that is different from the first direction,
wherein the first side surface includes a first modified region formed in the first direction, and the second side surface includes a second modified region formed in the second direction,
wherein the first modified region includes a region having a width that is different from a width of the second modified region, and wherein the first modified region includes first sub modified regions that are spaced apart from each other by a first isolation distance.

9. The light emitting module of claim 8, wherein the second modified region includes second sub modified regions that are spaced apart from each other by a second isolation distance.

10. The light emitting module of claim 9, wherein the second sub modified regions overlap one another.

11. The light emitting module of claim 9, further comprising second ruptured regions disposed between the second sub modified regions.

12. The light emitting module of claim 11, wherein the second ruptured regions include a region having a width that is greater than a width of one of the second sub modified regions.

13. The light emitting module of claim 8, wherein the second modified region is formed more densely than the first modified region.

14. A light emitting device comprising:
a substrate; and
a light emitting layer disposed on the substrate,
wherein the substrate includes a first side surface extending in a first direction and a second side surface extending in a second direction, the first and second directions crossing each other,
wherein the first side surface includes a first modified region formed in the first direction, and the second side surface includes a second modified region formed in the second direction,
wherein the first modified region includes a region having a width that is different from a width of the second modified region, and
wherein the first modified region includes first sub modified regions that are spaced apart from each other by a first isolation distance.

15. The light emitting device of claim 14, wherein the second modified region includes second sub modified regions that are spaced apart from each other by a second isolation distance.

16. The light emitting device of claim 14, wherein the second modified region is formed more densely than the first modified region.

17. The light emitting device of claim 15, wherein the second sub modified regions overlap one another.

* * * * *